(12) United States Patent
Hishiya

(10) Patent No.: US 7,259,026 B2
(45) Date of Patent: Aug. 21, 2007

(54) METHOD AND APPARATUS FOR PROCESSING ORGANOSILOXANE FILM

(75) Inventor: Shingo Hishiya, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 133 days.

(21) Appl. No.: 10/552,993

(22) PCT Filed: Apr. 13, 2004

(86) PCT No.: PCT/JP2004/005251

§ 371 (c)(1),
(2), (4) Date: Oct. 13, 2005

(87) PCT Pub. No.: WO2004/097921

PCT Pub. Date: Nov. 11, 2004

(65) Prior Publication Data

US 2006/0211268 A1  Sep. 21, 2006

(30) Foreign Application Priority Data

Apr. 25, 2003 (JP) .............................. 2003-121587

(51) Int. Cl.
*H01L 21/00* (2006.01)
(52) U.S. Cl. .................... 438/5; 438/448; 118/720; 428/405
(58) Field of Classification Search .................. 438/5, 438/448; 118/720, 725; 428/405
See application file for complete search history.

(56) References Cited

U.S. PATENT DOCUMENTS 4,894,428 A * 1/1990 Thoma et al. ............. 528/45

FOREIGN PATENT DOCUMENTS

| JP | 7-283212 | 10/1995 |
|----|----------|---------|
| JP | 2001-308089 | 11/2001 |
| JP | 2002-501674 | 1/2002 |
| JP | 2003-158126 | 5/2003 |
| WO | 03/021658 | 3/2003 |

* cited by examiner

*Primary Examiner*—William David Coleman
(74) *Attorney, Agent, or Firm*—Oblon, Spivak, McClelland, Maier & Neustadt, P.C.

(57) ABSTRACT

There is provided a method and apparatus for processing an organosiloxane film, which allow an inter-level insulating film with a low dielectric constant to be formed at a low heat process temperature. A semiconductor (10) with a coating film formed thereon is loaded into a reaction tube (2) of a heat-processing apparatus (1). Then, the interior of the reaction tube (2) is stabilized at a predetermined pressure, and hydrogen is supplied into an inner tube (3) through an acidic gas feed line (13), to heat the coating film under an acidic atmosphere. Then, the interior of the reaction tube (2) is heated up to a predetermined temperature, while heating the coating film under an acidic atmosphere. Then, gas inside the reaction tube (2) is exhausted, and ammonia is supplied into the inner tube (3) through an alkaline gas feed line (14), to heat the coating film under an alkaline atmosphere.

15 Claims, 4 Drawing Sheets

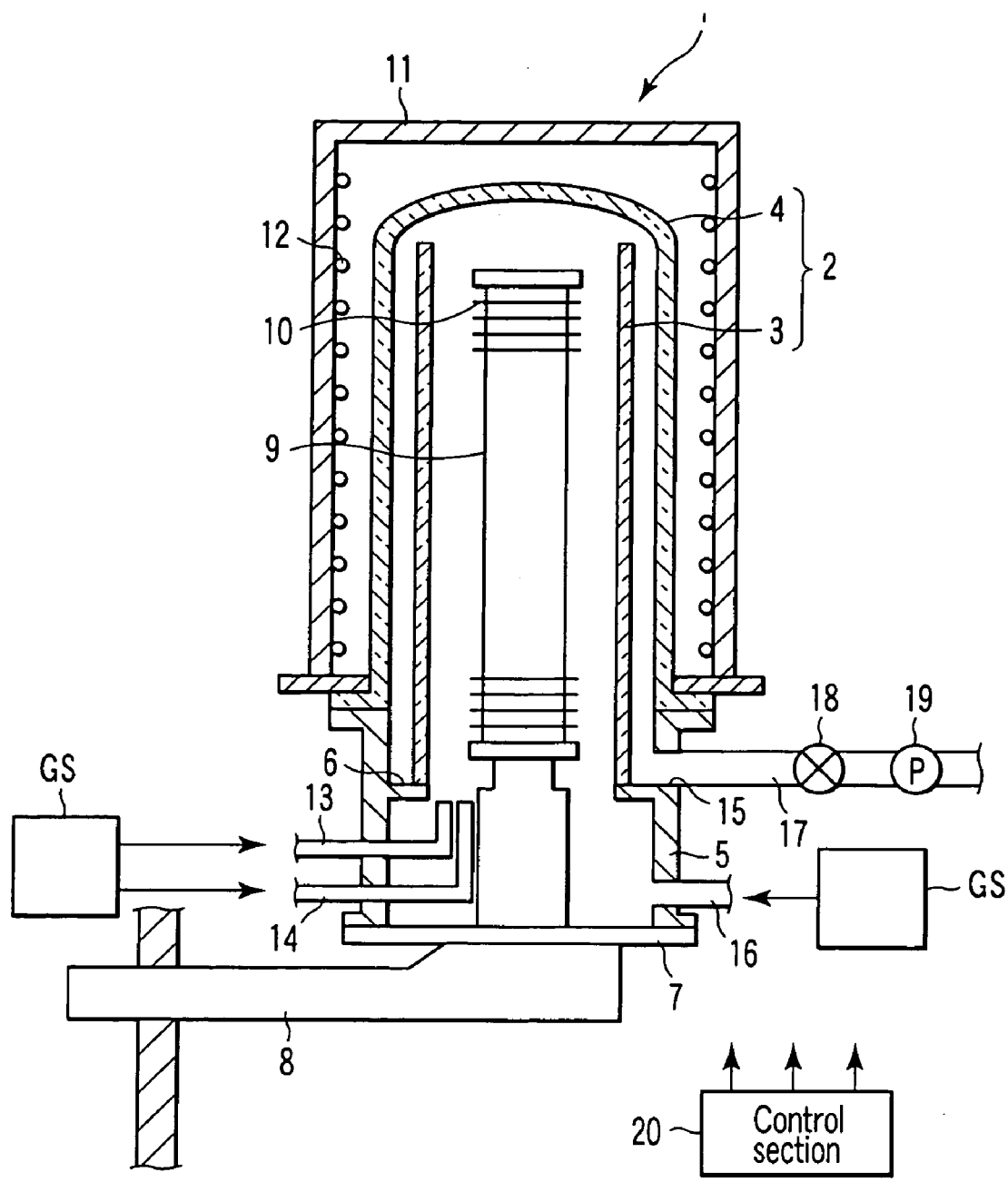
F I G. 1

| | First heating | | | Second heating | |
|---|---|---|---|---|---|
| | Temperature | Heating time | Temperature-up time | Temperature | Time |
| Present example 1 | 200°C | 5 minutes | 5 minutes | 350°C | 30 minutes |
| Present example 2 | 200°C | 5 minutes | 5 minutes | 350°C | 15 minutes |
| Present example 3 | 200°C | 5 minutes | 5 minutes | 350°C | 5 minutes |
| Present example 4 | 200°C | 5 minutes | 3 to 4 minutes | 300°C | 30 minutes |

| | First heating | | | Second heating | |
|---|---|---|---|---|---|
| | Temperature | Heating time | Temperature-up time | Temperature | Time |
| Present example 5 | 150°C | 5 minutes | 5 minutes | 300°C | 30 minutes |
| Present example 6 | 200°C (350°C) | 5 minutes (+5 minutes) | 5 minutes | 350°C | 30 minutes |
| Present example 7 | 350°C | 5 minutes | --- | 350°C | 30 minutes |

METHOD AND APPARATUS FOR PROCESSING ORGANOSILOXANE FILM

TECHNICAL FIELD

The present invention relates to a method and apparatus for processing an organosiloxane film by performing a heat process on a target substrate with a coating film of a polysiloxane base solution applied thereon, thereby baking the coating film.

BACKGROUND ART

In order to increase the operational speed of LSIs, it is required to decrease the specific dielectric constant of inter-level insulating films. As an inter-level insulating film with a low dielectric constant, an organosiloxane film is known. Where an organosiloxane film is formed, a coating film of a polysiloxane base solution having an organic functional group is first formed by spin coating on a target substrate, such as a semiconductor wafer. Then, a heat process (baking process) is performed on the wafer to bake the coating film.

For example, Jpn. Pat. Appln. KOKAI Publication No. 2001-308089 discloses a method of forming an organosiloxane film of this kind. According to this method, a process of baking a coating film is performed at a temperature of, e.g., from 400 to 450° C. for about 30 minutes. This baking process is performed within a nitrogen atmosphere to prevent organic functional groups from decomposing.

Jpn. Pat. Appln. KOKAI Publication No. 2003-158126 (published on May 30, 2003), discloses an improved method of forming an organosiloxane film. According to this method, a catalytic gas, such as a mixture gas of ammonia and water, dinitrogen oxide gas, or hydrogen gas, is used in the baking process. In this case, the process temperature can be lowered to a temperature of from 300 to 400° C.

DISCLOSURE OF INVENTION

An object of the present invention is to provide a method and apparatus for processing an organosiloxane film, which allow an inter-level insulating film with a low dielectric constant to be formed at a low heat-processing temperature.

Another object of the present invention is to provide a method and apparatus for processing an organosiloxane film, which allow an inter-level insulating film with a low dielectric constant to be formed by a heat process with a low temperature and short time.

According to a first aspect of the present invention, there is provided a method for processing an organosiloxane film, the method comprising:

loading a target substrate with a coating film formed thereon into a reaction chamber, the coating film comprising a polysiloxane base solution having an organic functional group; and performing a heat process on the target substrate within the reaction chamber to bake the coating film, wherein the heat process comprises a first heating step of heating the coating film while forming an atmosphere with a first pH and a first process temperature within the reaction chamber, the first pH being set to promote hydrolysis reaction of the coating film, and subsequently to the first heating step, a second heating step of heating the coating film while forming an atmosphere with a second pH and a second process temperature within the reaction chamber, the second pH being set to promote condensation reaction of the coating film.

According to a second aspect of the present invention, there is provided a method for processing an organosiloxane film, the method comprising:

loading a target substrate with a coating film formed thereon into a reaction chamber, the coating film comprising a polysiloxane base solution having an organic functional group; and performing a heat process on the target substrate within the reaction chamber to bake the coating film, wherein the heat process comprises a first heating step of heating the coating film while forming an atmosphere with a first pH and a first process temperature within the reaction chamber, the first pH being set to be less than 4.5 by supplying an acidic gas into the reaction chamber, and the first process temperature being set to range from 25 to 400° C., subsequently to the first heating step, a purge step of purging the acidic gas from the reaction chamber, and subsequently to the purge step, a second heating step of heating the coating film while forming an atmosphere with a second pH and a second process temperature within the reaction chamber, the second pH being set to be higher than 7 by supplying an alkaline gas into the reaction chamber, and the second process temperature being set to range from 150 to 400° C.

According to a third aspect of the present invention, there is provided an apparatus for processing an organosiloxane film, by performing a heat process on a target substrate with a coating film formed thereon to bake the coating film, the coating film comprising a polysiloxane base solution having an organic functional group, the apparatus comprising:

a reaction chamber configured to accommodate the target substrate;

a temperature adjusting section configured to adjust temperature inside the reaction chamber;

a pH-adjusting gas supply section configured to selectively supply an acidic gas and an alkaline gas into the reaction chamber so as to adjust pH inside the reaction chamber;

an exhaust section configured to exhaust gas inside the reaction chamber; and a control section configured to control the temperature adjusting section, the pH-adjusting gas supply section, and the exhaust section.

BRIEF DESCRIPTION OF DRAWINGS

FIG. 1 is a sectional side view showing a vertical heat-processing apparatus according to an embodiment of the present invention;

BEST MODE FOR CARRYING OUT THE INVENTION

Figure 2:
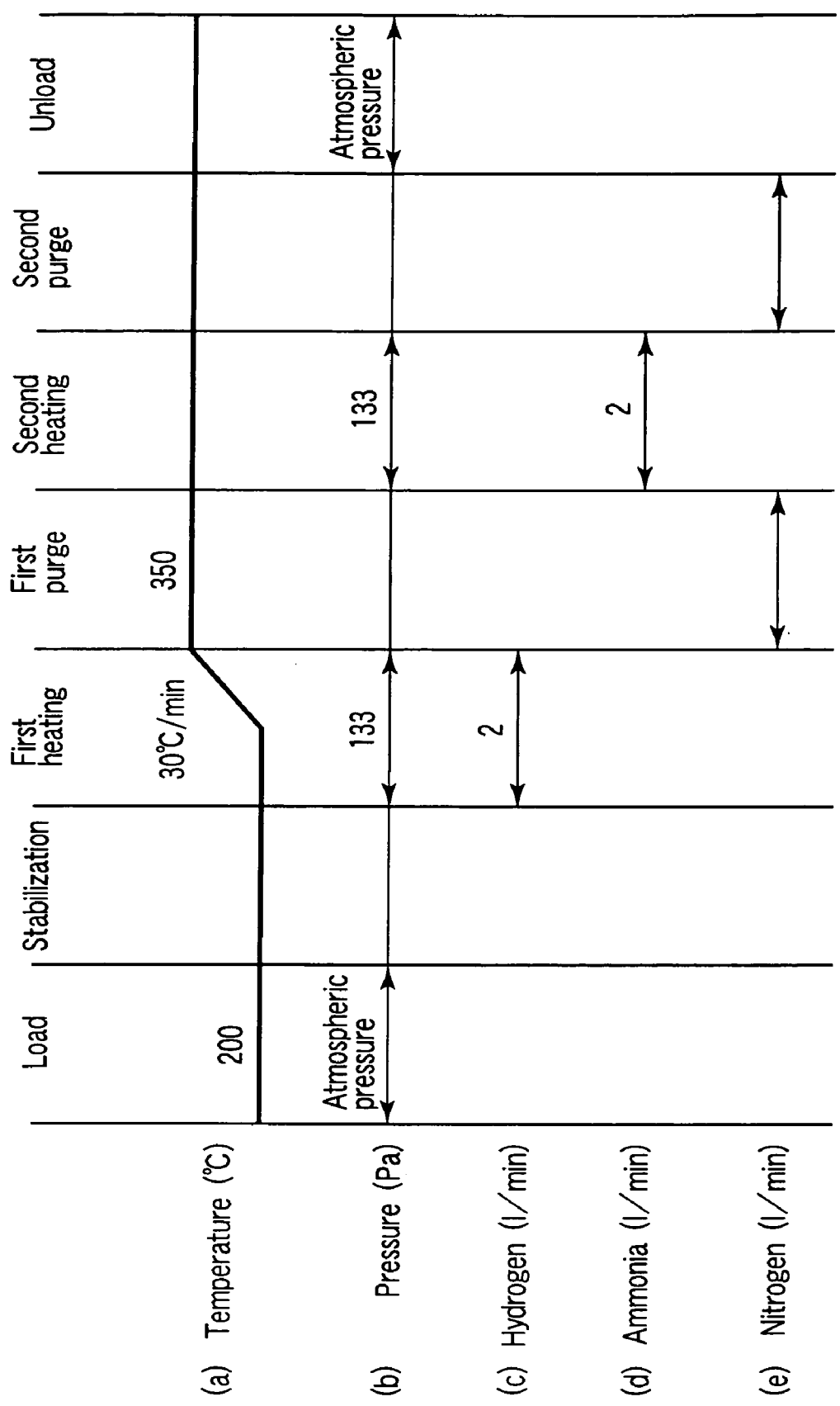
FIG. 2 is a view showing the recipe of a heat-processing method according to an embodiment of the present invention.

As the number of multi-layered interconnection lines is increased and the structure is downsized in LSIs, inter-level insulating films used therein are required to have a lower dielectric constant property, and also to be formed at a lower process temperature. The latter is intended to alleviate the thermal history of a film earlier formed in multi-layered structures, because such a film is subjected to heat processes repeatedly performed thereafter. Further, it is an ongoing requirement to reduce the process time involved in semiconductor manufacturing. However, where the process temperature is lowered and the process time is shortened, a coating film may be insufficiently heat-processed, thereby hindering formation of an inter-level insulating film with a low dielectric constant.

Particularly, where a polysiloxane base solution is used along with a low process temperature and a short process time, formation of an insulating film with a low dielectric constant becomes difficult. This problem is thought to arise from the following mechanism. Specifically, the baking process (or heat process) is used to cause (—SiOH)'s present in an applied coating solution to inter-react with each other, thereby producing (—Si—O—Si—)'s. If the coating film is supplied with insufficient thermal energy, the reaction described above cannot propagate through the entire coating film. As a consequence, a large number of (—SiOH)'s remain in the film, which hinders the dielectric constant from decreasing.

Embodiments of the present invention achieved on the basis of the findings given above will now be described with reference to the accompanying drawings.

FIG. 1 is a sectional side view showing a vertical heat-processing apparatus of the batch type according to an embodiment of the present invention. As shown in FIG. 1, the heat-processing apparatus 1 includes a reaction tube (reaction chamber) 2, which is essentially cylindrical with a longitudinal direction directed in the vertical direction. The reaction tube 2 has a double-tube structure formed of an inner tube 3 and an outer tube 4 having a closed top, wherein the outer tube 4 covers the inner tube 3 with a constant gap interposed therebetween. The inner tube 3 and outer tube 4 are formed of a heat-resistant material, such as quartz.

A cylindrical manifold 5 made of stainless steel (SUS) is disposed below the outer tube 4. The manifold 5 is airtightly connected to the bottom of the outer tube 4. The inner tube 3 is supported by a support ring 6, which is integrally formed with the manifold 5 and extends from the inner wall of the manifold 5.

The manifold 5 is engaged with a lid 7 disposed therebelow, which is moved up and down by a boat elevator 8. When the lid 7 is moved up by the boat elevator 8, the bottom port of the manifold 5 is closed.

A wafer boat 9 made of, e.g., quartz is placed on the lid 7. The wafer boat 9 is arranged to support a plurality of semiconductor wafers (target substrates) 10, at predetermined intervals in the vertical direction. Each of the wafers 10 is provided with a coating film formed thereon. For example, the coating film consists of a coating solution containing polysiloxane having an organic functional group, which has been applied onto the semiconductor wafer 10 by spin coating. The coating film will be heat-processed (baked) by the heat-processing apparatus 1. As a consequence, an inter-level insulating film, such as an insulating film of polysiloxane having an organic functional group, which is an insulating film with a low dielectric constant, is formed on the semiconductor wafer 10.

A heat-insulating structure 11 is disposed to surround the reaction tube 2. The heat-insulating structure 11 is provided with a heater 12, such as a resistance heating body, which is disposed on the inner wall of the structure 11 and is used to raise the temperature. The interior of the reaction tube 2 is heated to a predetermined temperature by the heater 12, so that the wafers 10 are heated to a predetermined temperature.

An acidic gas feed line 13 for supplying an acidic gas is inserted through the sidewall of the manifold 5, so that an acidic atmosphere can be formed within the reaction tube 2. The acidic gas feed line 13 is connected to a predetermined acidic gas supply source (not shown) through a mass-flow controller (not shown) and so forth inside the gas supply section GS. The acidic gas may be exemplified by hydrogen.

For example, as shown in FIG. 1, the acidic gas feed line 13 is inserted through the sidewall of the manifold 5 at a position below the support ring 6 (below the inner tube 3). The acidic gas feed line 13 is bent upward in the manifold 5 to face the interior of the inner tube 3 from below. In practice, a plurality of acidic gas feed lines 13 are disposed, but FIG. 1 depicts only one of them.

Further, an alkaline gas feed line 14 for supplying an alkaline gas is inserted through the sidewall of the manifold 5, so that an alkaline atmosphere can be formed within the reaction tube 2. The alkaline gas feed line 14 is connected to a predetermined alkaline gas supply source (not shown) through a mass-flow controller (not shown) and so forth inside the gas supply section GS. The alkaline gas may be exemplified by ammonia.

For example, as shown in FIG. 1, the alkaline gas feed line 14 is inserted through the sidewall of the manifold 5 at a position below the support ring 6 (below the inner tube 3). The alkaline gas feed line 14 is bent upward in the manifold 5 to face the interior of the inner tube 3 from below. In practice, a plurality of alkaline gas feed lines 14 are disposed, but FIG. 1 depicts only one of them.

Furthermore, a purge gas feed line 16 for supplying a purge gas is connected to the sidewall of the manifold 5. The purge gas feed line 16 is connected to a predetermined purge gas supply source (not shown) through a mass-flow controller (not shown) and so forth inside the gas supply section GS. The purge gas may be exemplified by an inactive gas, such as nitrogen.

An exhaust port 15 is formed in the sidewall of the manifold 5 above the gas feed lines 13, 14, and 16. The exhaust port 15 is formed above the support ring 6, and communicates with the space formed between the inner tube 3 and outer tube 4 of the reaction tube 2. The exhaust gas or the like generated inside the inner tube 3 is exhausted through the space formed between the inner tube 3 and outer tube 4 to the exhaust port 15.

The exhaust port 15 is airtightly connected to an exhaust line 17. The exhaust line 17 is provided with a valve 18 and a vacuum pump 19 disposed thereon in this order from the upstream side. The valve 18 adjusts the opening ratio to control the pressure inside the reaction tube 2 to be a predetermined pressure. The vacuum pump 19 exhausts gas inside the reaction tube 2 through the exhaust line 17, and thereby adjusts the pressure inside the reaction tube 2. The exhaust line 17 is provided with a trap, a scrubber, and so forth (not shown) disposed thereon. The exhaust gas from the reaction tube 2 is detoxified and then exhausted out of the heat-processing apparatus 1.

The boat elevator 8, temperature-raising heater 12, acidic gas feed line 13, alkaline gas feed line 14, purge gas feed line 16, valve 18, and vacuum pump 19 are controlled by a control section 20. The control section 20 comprises a microprocessor, a process controller, and so forth. Temperatures and pressures at respective portions of the heat-processing apparatus 1 are measured and transmitted to the control section 20. The control section 20 outputs control signals or the like to the respective portions based on the measurement data to control them. As a consequence, these portions of the heat-processing apparatus 1 are controlled in accordance with, e.g., a recipe (time sequence) shown in FIG. 2.

Next, an explanation will be give of a heat-processing method, using the heat-processing apparatus 1 described above. This embodiment is exemplified by a case where hydrogen is used as the acidic gas and ammonia is used as the alkaline gas in processing an organosiloxane film. In summary, a coating film of a polysiloxane base solution having an organic functional group is formed by spin coating on a target substrate or semiconductor wafer. Then, the wafer is subjected to a heat process (baking process) to bake the coating film.

Specifically, a coating film of a polysiloxane base solution is formed on a semiconductor wafer by, e.g., spin coating and drying performed thereon. The solution contains a bond of a silicon atom with a functional group selected from the group consisting of a methyl group ($—CH_3$), phenyl group ($—C_6H_5$), and vinyl group ($—CH=CH_2$).

The polysiloxane is prepared by hydrolyzing a silane compound having a hydrolyte group under the existence or non-existence of a catalytic agent to condense it. A preferable example of a silane compound containing a hydrolyte group is trimethoxysilane, triethoxysilane, methyltrimethoxysilane, methyltriethoxysilane, methyltri-n-propoxysilane, methyltri-iso-propoxysilane, ethyltrimethoxysilane, ethyltriethoxysilane, vinyltrimethoxysilane, vinyltriethoxysilane, phenyltrimethoxysilane, phenyltriethoxysilane, dimethyldimethoxysilane, dimethyldiethoxysilane, diethyldimethoxysilane, diethyldiethoxysilane, diphenyldimethoxysilane, diphenyldiethoxysilane, tetramethoxysilane, tetraethoxysilane, tetra-n-propoxysilane, tetra-iso-propoxysilane, tetra-n-butoxysilane, tetra-sec-butoxysilane, tetra-tert-butoxysilane, or tetraphenoxysilane.

The catalytic agent used in hydrolysis may be an acid, chelate compound, or alkali, and is preferably an alkali, such as ammonia or alkylamine.

The molecular weight of polysiloxane is 100,000 to 10,000,000, preferably 100,000 to 9,000,000, and more preferably 200,000 to 8,000,000 in weight-average molecular weight obtained by polystyrene conversion in accordance with a GPC method. Where it is less than 50,000, the dielectric constant and elastic modulus may be insufficient. Where it is greater than 10,000,000, the uniformity of a coating film may be lowered.

It is preferable to use a polysiloxane base solution that satisfies the following formula.

$0.9 \geq R/Y \geq 0.2$ (where R denotes the atomicity of the methyl group, phenyl group, or vinyl group, and Y denotes the atomicity of Si, both in polysiloxane).

The polysiloxane base solution (coating solution) is prepared by dissolving such polysiloxane into an organic solvent. A concrete example of a solvent to be used for this is at least one selected from the group consisting of an alcohol base solvent, ketone base solvent, amide base solvent, and ester base solvent. In addition to polysiloxane, the coating solution may contain an arbitrary component, such as a surfactant, or pyrolytic polymer, as needed.

A wafer 10 with a coating film thus formed thereon is subjected to a heat process by the heat-processing apparatus 1 in a sequence as follows. In this sequence, the control section 20 controls respective portions of the heat-processing apparatus 1 explained below.

At first, the interior of the reaction tube 2 is heated by the temperature-raising heater 12 at a predetermined temperature within a temperature range covering the baking temperature and curing temperature (for example, 25 to 400° C.), e.g., at 200° C. in this example, as shown in FIG. 2, (a). The baking temperature is used for dehydrating the coating film, and is 50 to 150° C. where the coating film comprises polysiloxane having an organic functional group. The curing temperature is used for curing the coating film, and is 150 to 400° C. where the coating film comprises polysiloxane having an organic functional group.

On the other hand, the wafer boat 9 holding semiconductor wafers 10 each with the coating film formed thereon is placed on the lid 7 that has been moved down by the boat elevator 8. Then, the lid 7 is moved up by the boat elevator 8 to load the semiconductor wafers 10 into the reaction tube 2. As a consequence, the semiconductor wafers 10 are accommodated inside the inner tube 3 of the reaction tube 2, and the reaction tube 2 is airtightly closed (load step).

After the reaction tube 2 is airtightly closed, the opening ratio of the valve 18 is adjusted, and the vacuum pump 19 is driven to exhaust gas inside the reaction tube 2, thereby starting pressure reduction of the reaction tube 2. The interior of the reaction tube 2 is kept exhausted until the pressure inside the reaction tube 2 is reduced to a predetermined pressure of, e.g., 133 Pa (1 Torr) in this example, as shown in FIG. 2, (b), (stabilization step).

After the interior of the reaction tube 2 is stabilized at the predetermined pressure, a first heating step is performed. Specifically, the coating film is heated while hydrogen used as an acidic gas is supplied into the reaction tube 2 through the acidic gas feed line 13 at a predetermined flow rate of, e.g., 2 liters/min in this example, as shown in FIG. 2, (c). The interior of the reaction tube 2 is set to be an acidic atmosphere with hydrogen supplied into the reaction tube 2, and thus the coating film on the semiconductor wafers 10 is subjected to a heat process within the acidic atmosphere.

After the coating film is subjected to the heat process within the acidic atmosphere at 200° C. for a predetermined time, the interior of the reaction tube 2 is heated up by the temperature-raising heater 12 to a predetermined curing temperature (for example, 150 to 400° C.), e.g., to 350° C. in this example, as shown in FIG. 2, (a). In this way, the coating film on the semiconductor wafers 10 is subjected to a heat process within the acidic atmosphere, while the temperature inside the reaction tube 2 is raised.

At this time, the heater 12 is controlled to raise the temperature inside the reaction tube 2 at a rate of, e.g., 30° C. per minute (30° C./min) in this example, as shown in FIG. 2, (a). Since the temperature inside the reaction tube 2 is raised to a curing temperature during the first heating step, there is no need to use additional time to raise the temperature, thereby shortening the baking time for the coating film.

When the temperature inside the reaction tube 2 is raised to a predetermined curing temperature (350° C.), the supply of hydrogen through the acidic gas feed line 13 is stopped, and thus the first heating step is finished. As described above, the first heating step is arranged to perform a heat process on the coating film on the semiconductor wafers 10 within an acidic atmosphere, while the temperature inside the reaction tube 2 is set at a predetermined temperature within the baking temperature range or higher, and then is changed therefrom to a predetermined curing temperature.

Then, nitrogen is supplied through the purge gas feed line 16 at a predetermined flow rate, while the opening ratio of the valve 18 is adjusted and the vacuum pump 19 is driven, to exhaust gas (hydrogen) inside the reaction tube 2 through the exhaust line 17 (first purge step). It is preferable to perform cyclic purge, in which the gas exhaust and nitrogen gas supply for the interior of the process tube 2 are repeated a plurality of times, in order to swiftly and reliably exhaust the gas inside the process tube 2.

After the gas inside the reaction tube 2 is exhausted, the supply of nitrogen through the gas feed line 16 is stopped, and a second heating step is then performed. Specifically, the coating film is heated while ammonia used as an alkaline gas is supplied into the reaction tube 2 through the alkaline gas feed line 14 at a predetermined flow rate of, e.g., 2 liters/min in this example, as shown in FIG. 2, (d). The interior of the reaction tube 2 is set to be an alkaline atmosphere with ammonia supplied into the reaction tube 2, and thus the coating film on the semiconductor wafers 10 is subjected to a heat process within the alkaline atmosphere. During this heat process, the coating film is baked, and an inter-level insulating film (organosiloxane film) is thereby formed on the semiconductor wafers 10.

Next, an explanation will be given of baking (heat process) of a coating film which has been formed by applying a coating solution containing polysiloxane having an organic functional group. When the coating film containing polysiloxane having an organic functional group is supplied with thermal energy, a hydrolysis reaction first occurs, and a condensation reaction then occurs. As a consequence, the coating film is baked, so that an inter-level insulating film with a low dielectric constant is formed.

Figures 3, 4:
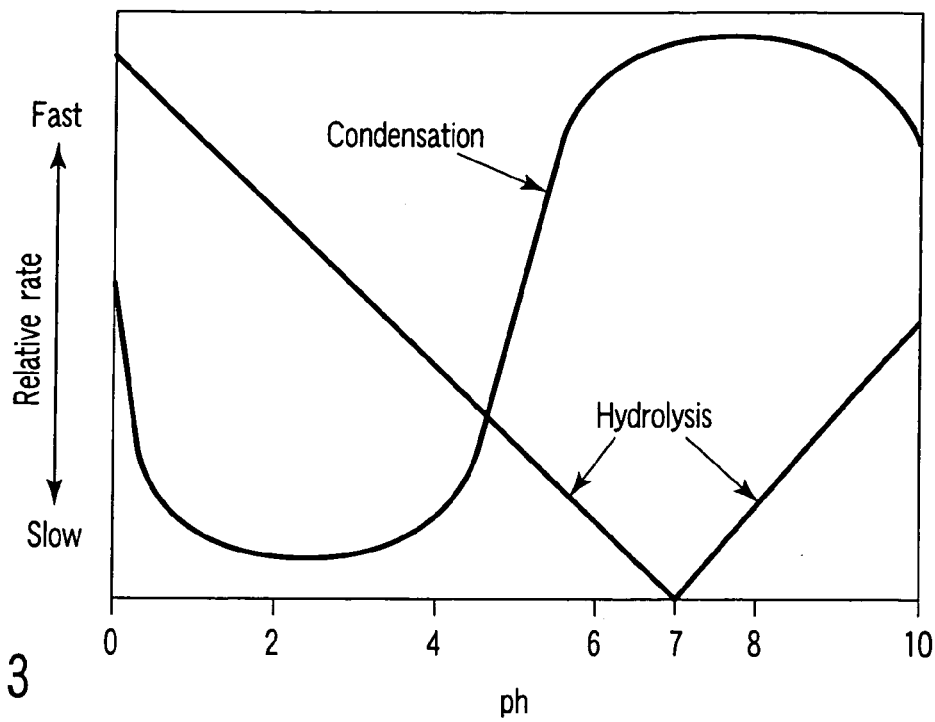
FIG. 3 is a graph showing the relationship between relative rates of the hydrolysis reaction and condensation reaction of a coating film and the pH of the atmosphere within a reaction chamber.
FIG. 4 is a diagram showing heat process conditions used in an experiment for present examples according an embodiment of the present invention.

FIG. 3 is a graph showing the relationship between relative rates of the hydrolysis reaction and condensation reaction of a coating film and the pH of the atmosphere within the reaction chamber. As shown in FIG. 3, the relative rate of the hydrolysis reaction increases under an acidic atmosphere, and particularly under an acidic atmosphere satisfying pH<4.5. In other words, such an acidic atmosphere facilitates progress of the hydrolysis reaction of the coating film.

On the other hand, the relative rate of the condensation reaction increases under an atmosphere satisfying pH>4.5. In other words, an atmosphere satisfying pH>4.5 facilitates progress of the condensation reaction of the coating film. Particularly, the condensation reaction has the maximum relative rate, where it is performed near pH=8. Further, the interior of the reaction tube 2 can be more easily set at an alkaline atmosphere (ph>7) than at an acidic atmosphere satisfying pH<4.5. Accordingly, the condensation reaction is preferably performed under an alkaline atmosphere (ph>7).

To reiterate, the interior of the reaction tube 2 is preferably set to be an acidic atmosphere satisfying pH<4.5, in the early stage of the heat process (during the hydrolysis reaction). Then, the interior of the reaction tube 2 is preferably set to be an alkaline atmosphere, in the late stage of the heat process (during the condensation reaction).

According to this embodiment, the first heating step performs heating under an acidic atmosphere, thereby promoting the hydrolysis reaction. Further, the second heating step performs heating under an alkaline atmosphere, thereby promoting the condensation reaction. These arrangements thus facilitate the heat process (baking reaction). As a consequence, even where the heat process temperature is lowered to 350° C. from a conventional value of, e.g., 400 to 450° C., the baking reaction sufficiently proceeds to form an inter-level insulating film with a low dielectric constant. Alternatively, even where the heat process time is shortened, the baking reaction sufficiently proceeds to form an inter-level insulating film with a low dielectric constant.

Returning to the explanation on steps of the heat-processing method, nitrogen is then supplied through the purge gas feed line 16 at a predetermined flow rate, while the opening ratio of the valve 18 is adjusted and the vacuum pump 19 is driven, to exhaust gas (ammonia) inside the reaction tube 2 through the exhaust line 17 (second purge step). It is preferable to perform cyclic purge, in which the gas exhaust and nitrogen gas supply for the interior of the process tube 2 are repeated a plurality of times, in order to swiftly and reliably exhaust the gas inside the process tube 2. Subsequently, the pressure inside the process tube 2 is returned to atmospheric pressure, and the lid 7 is moved down by the boat elevator 8, thus the semiconductor wafers 10 are unloaded (unload step).

In order to examine some of the effects of this embodiment, an experiment was conducted to form an inter-level insulating film under different heat process conditions, and measure the specific dielectric constant of the film thus formed. More specifically, different heating temperatures and heating times were used for the second heating step when semiconductor wafers 10 with a coating film formed thereon were subjected to a heat process (baking), using the heat-processing apparatus 1. FIG. 4 is a diagram showing heat process conditions used in the experiment for present examples according an embodiment of the present invention. As shown in FIG. 4, the heating temperature and the heating time of the second heating step were respectively set at 350° C. and 30 minutes for the present example 1, 350° C. and 15 minutes for the present example 2, 350° C. and 5 minutes for the present example 3, and 300° C. and 30 minutes for the present example 4.

The coating film was formed by spin-coating a coating solution containing polysiloxane having an organic functional group onto each semiconductor wafer 10. After the heat process on the coating film was performed to form an inter-level insulating film, an electrode pattern consisting of aluminum or a mixture of aluminum and copper was formed on the inter-level insulating film to form a sample. Then, the specific dielectric constant of the inter-level insulating film of this sample was measured by a CV method, at a frequency of 100 kHz, using an LCR meter.

Figures 5, 6:
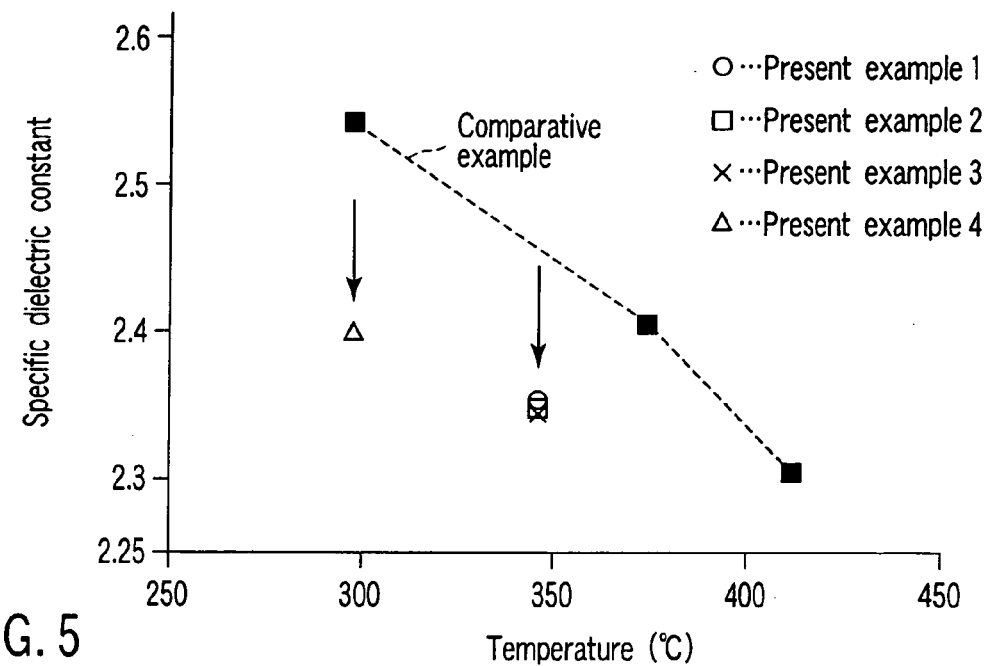
FIG. 5 is a graph showing the relationship between the heat process temperature and the specific dielectric constant of films formed in the present examples shown in FIG. 4.
FIG. 6 is a diagram showing heat process conditions used in an experiment for present examples according an embodiment of the present invention.

FIG. 5 is a graph showing the relationship between the heat process temperature and the specific dielectric constant of films formed in the present examples shown in FIG. 4. FIG. 5 also shows the specific dielectric constant of an inter-level insulating film according to a comparative example, in which the coating film was subjected to baking under a conventional nitrogen atmosphere. The heating time of the second heating step was set at 60 minutes for the comparative example.

As shown in FIG. 5, it was confirmed that an inter-level insulating film with a low dielectric constant was formed even where the heating temperature was lowered to 350° C. or 300° C. from a conventional value of 400° C. or more. Further, it was confirmed that an inter-level insulating film with a low dielectric constant was formed even where the heating time (the heat process time of the second heating step) was shortened to 5 minutes. It is thought that a low heat process temperature enabled such an inter-level insulating film with a low dielectric constant to be formed, due to control for the interior of the reaction tube 2 to have pH atmospheres for promoting the hydrolysis reaction and condensation reaction of the coating film, thereby causing the baking reaction to sufficiently proceed. It is also though that a short heat process time of 5 minutes enabled such an inter-level insulating film with a low dielectric constant to be formed, due to control for the interior of the reaction tube 2 to have pH atmospheres for promoting the hydrolysis reaction and condensation reaction of the coating film, thereby causing the baking reaction to sufficiently proceed.

Further, in order to examine some of the effects of this embodiment, another experiment was conducted to form an inter-level insulating film under different heat process conditions, and measure the specific dielectric constant of the film thus formed. More specifically, different heating temperatures and heating times were used for the first heating step when semiconductor wafers 10 with a coating film formed thereon were subjected to a heat process (baking), using the heat-processing apparatus 1. FIG. 6 is a diagram showing heat process conditions used in the experiment for present examples according an embodiment of the present invention.

As shown in FIG. 6, the heating temperature and the heating time of the first heating step were respectively set at 150° C. and 5 minutes for the present example 5, (200° C. and 5 minutes)+(350° C. and 5 minutes) for the present example 6, and 350° C. and 5 minutes for the present example 7. In the present example 6, the temperature was maintained at 200° C. for 5 minutes, then raised to 350° C. in 5 minutes, and then maintained at 350° C. for 5 minutes. Further, the heating temperature and the heating time of the second heating step were respectively set at 300° C. and 30 minutes for the present example 5, 350° C. and 30 minutes for the present example 6, and 350° C. and 30 minutes for the present example 7.

As a result, the present example 5 showed almost the same specific dielectric constant as the present example 4. The present examples 6 and 7 showed almost the same specific dielectric constant as the present examples 1 to 3. Accordingly, it was confirmed that an inter-level insulating film with a low dielectric constant was formed even where the first heating temperature was lowered to a temperature within 150 to 350° C.

As described above, according to this embodiment, the interior of the reaction tube 2 is controlled to have pH atmospheres for promoting the hydrolysis reaction of the coating film and for promoting the condensation reaction thereof. As a consequence, the baking reaction of the coating film can sufficiently proceed, so that an inter-level insulating film with a low dielectric constant can be obtained with a low heat process temperature. Further, an inter-level insulating film with a low dielectric constant can be obtained, using a heat process with a low temperature and short time. Furthermore, according to this embodiment, the temperature inside the reaction tube 2 is raised to a curing temperature during the first heating step, thereby allowing the heat process time to be shortened.

The present invention is not limited to the embodiment described above, and it may be modified or applied in various manners. Next, an explanation will be given of other possible embodiments of the present invention.

In the embodiment described above, a coating film is formed on a semiconductor wafer 10 by spin-coating a coating solution containing polysiloxane having an organic functional group, and the coating film thus formed is subjected to baking to form an inter-level insulating film. For example, the coating solution containing polysiloxane having an organic functional group is prepared by dissolving polysiloxane having an organic functional group into an organic solvent. This solution may contain an arbitrary component, such as a surfactant, added thereto. An example of an inter-level insulating film thus formed is a film of porous MSQ (methyl silsesquioxan) or MSQ. Where an inter-level insulating film consists of porous MSQ, the film includes pores with a size in molecular or atomic order, such as 20 nm or less, formed therein.

In the embodiment described above, the interior of the reaction tube 2 is set to be an acidic atmosphere in the first heating step. Then, the interior of the reaction tube 2 is set to be an alkaline atmosphere in the second heating step. However, the first heating step only requires a pH atmosphere to promote the hydrolysis reaction of the coating film. Also, the second heating step only requires a pH atmosphere to promote the condensation reaction of the coating film. For example, the second heating step may be set to be a slightly acidic atmosphere of pH=6.

In the embodiment described above, hydrogen is used as an acidic gas, and ammonia is used as alkaline gas. However, other gases may be used as the acidic gas and alkaline gas, as far as they can change the pH inside the reaction tube 2, without affecting the baking of the coating film. For example, the acidic gas may consist of nitrogen oxide, dinitrogen oxide, monosilane, or disilane, in place of hydrogen. The alkaline gas may consist of trimethylamine in place of ammonia.

In the embodiment described above, the temperature inside the reaction tube 2 is raised during the first heating step to a predetermined temperature for the second heating step. Alternatively, for example, the temperature inside the reaction tube 2 may be raised during the first purge step.

In the embodiment described above, the unload temperature is set at, e.g., 350° C., which differs from the load temperature. However, the unload temperature and load temperature may be set at the same temperature. In this case, it is possible to shorten the time necessary for performing a sequential heat process.

In the embodiment described above, the processing apparatus is exemplified by a vertical heat-processing apparatus of the batch type with the reaction tube 2 having a double-tube structure, which is formed of the inner tube 3 and outer tube 4. However, the present invention may be applied to a heat-processing apparatus of the batch type with a process container having a single-tube structure, from which the inner tube 3 is excluded. Alternatively, the present invention may be applied to a heat-processing apparatus of the single-substrate type.

INDUSTRIAL APPLICABILITY

According to the present invention, where a polysiloxane based coating film formed on a substrate is subjected to a heat process to form an inter-level insulating film, an inter-level insulating film with a low dielectric constant can be formed even at a low heat process temperature.

The invention claimed is:
1. A method for processing an organosiloxane film, the method comprising:
loading a target substrate with a coating film formed thereon into a reaction chamber, the coating film comprising a polysiloxane base solution having an organic functional group; and
performing a heat process on the target substrate within the reaction chamber to bake the coating film, wherein the heat process comprises
a first heating step of heating the coating film while forming an atmosphere with a first pH and a first process temperature within the reaction chamber, the first pH being set to promote hydrolysis reaction of the coating film, and
subsequently to the first heating step, a second heating step of heating the coating film while forming an atmosphere with a second pH and a second process temperature within the reaction chamber, the second pH being set to promote condensation reaction of the coating film.

2. The method according to claim 1, wherein the heat process is arranged to selectively supply an acidic gas and an alkaline gas into the reaction chamber, thereby adjusting pH inside the reaction chamber.

3. The method according to claim 2, wherein the acidic gas comprises hydrogen, and the alkaline gas comprises ammonia.

4. The method according to claim 1, wherein the first pH is acidic value, and the second pH is alkaline value.

5. The method according to claim 1, wherein the first process temperature is selected from a temperature range that covers a temperature for dehydrating the coating film and a temperature for curing the coating film, and the second process temperature is selected from a temperature range for curing the coating film.

6. The method according to claim 5, wherein the first process temperature ranges from 25 to 400° C., and the second process temperature ranges from 150 to 400° C.

7. The method according to claim 5, wherein the first process temperature is set to be higher at an end of the first heating step than at a start thereof, and to be essentially equal at the end to the second process temperature.

8. A method for processing an organosiloxane film, the method comprising:
loading a target substrate with a coating film formed thereon into a reaction chamber, the coating film comprising a polysiloxane base solution having an organic functional group; and
performing a heat process on the target substrate within the reaction chamber to bake the coating film,
wherein the heat process comprises
a first heating step of heating the coating film while forming an atmosphere with a first pH and a first process temperature within the reaction chamber, the first pH being set to be less than 4.5 by supplying an acidic gas into the reaction chamber, and the first process temperature being set to range from 25 to 400° C.,
subsequently to the first heating step, a purge step of purging the acidic gas from the reaction chamber, and
subsequently to the purge step, a second heating step of heating the coating film while forming an atmosphere with a second pH and a second process temperature within the reaction chamber, the second pH being set to be higher than 7 by supplying an alkaline gas into the reaction chamber, and the second process temperature being set to range from 150 to 400° C.

9. An apparatus for processing an organosiloxane film, by performing a heat process on a target substrate with a coating film formed thereon to bake the coating film, the coating film comprising a polysiloxane base solution having an organic functional group, the apparatus comprising:
a reaction chamber configured to accommodate the target substrate;
a temperature adjusting section configured to adjust temperature inside the reaction chamber;
a pH-adjusting gas supply section configured to selectively supply an acidic gas and an alkaline gas into the reaction chamber so as to adjust pH inside the reaction chamber;
an exhaust section configured to exhaust gas inside the reaction chamber; and
a control section configured to control the temperature adjusting section, the pH-adjusting gas supply section, and the exhaust section.

10. The apparatus according to claim 9, wherein the acidic gas comprises hydrogen, and the alkaline gas comprises ammonia.

11. The apparatus according to claim 9, wherein the control section is configure to execute the heat process to comprise
a first heating step of heating the coating film while forming an atmosphere with a first pH and a first process temperature within the reaction chamber, the first pH being set to promote hydrolysis reaction of the coating film, and
subsequently to the first heating step, a second heating step of heating the coating film while forming an atmosphere with a second pH and a second process temperature within the reaction chamber, the second pH being set to promote condensation reaction of the coating film.

12. The apparatus according to claim 11, wherein the first pH is acidic value, and the second pH is alkaline value.

13. The apparatus according to claim 11, wherein the first process temperature ranges from 25 to 400° C., and the second process temperature ranges from 150 to 400° C.

14. The apparatus according to claim 11, wherein the first process temperature is set to be higher at an end of the first heating step than at a start thereof, and to be essentially equal at the end to the second process temperature.

15. The apparatus according to claim 9, wherein the control section is configure to execute the heat process to comprise
a first heating step of heating the coating film while forming an atmosphere with a first pH and a first process temperature within the reaction chamber, the first pH being set to be less than 4.5 by supplying an acidic gas into the reaction chamber, and the first process temperature being set to range from 25 to 400° C.,
subsequently to the first heating step, a purge step of purging the acidic gas from the reaction chamber, and
subsequently to the purge step, a second heating step of heating the coating film while forming an atmosphere with a second pH and a second process temperature within the reaction chamber, the second pH being set to be higher than 7 by supplying an alkaline gas into the reaction chamber, and the second process temperature being set to range from 150 to 400° C.

* * * * *